United States Patent
Lee et al.

(10) Patent No.: US 10,845,387 B2
(45) Date of Patent: Nov. 24, 2020

(54) PROBE CARD DEVICE AND MATCHING PROBE THEREOF

(71) Applicant: CHUNGHWA PRECISION TEST TECH. CO., LTD., Taoyuan (TW)

(72) Inventors: Wen-Tsung Lee, New Taipei (TW); Kai-Chieh Hsieh, Taoyuan (TW); Chao-Hui Tseng, New Taipei (TW); Hsien-Yu Wang, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 88 days.

(21) Appl. No.: 16/404,000

(22) Filed: May 6, 2019

(65) Prior Publication Data

US 2020/0158756 A1    May 21, 2020

(30) Foreign Application Priority Data

Nov. 21, 2018    (TW) .............................. 107141538 A (51) Int. Cl.
*G01R 1/073*    (2006.01)
*G01R 31/28*    (2006.01)
(Continued)

(52) U.S. Cl.
CPC ..... *G01R 1/07378* (2013.01); *G01R 1/07342* (2013.01); *G01R 31/2831* (2013.01);
(Continued)

(58) Field of Classification Search
CPC ... G01R 1/00; G01R 1/02; G01R 1/06; G01R 1/067; G01R 1/06772; G01R 1/073;
G01R 1/07307; G01R 1/07342; G01R 1/07364; G01R 1/07378; G01R 3/00; G01R 31/00; G01R 31/26; G01R 31/28; G01R 31/2808; G01R 31/282; G01R 31/2831; G01R 31/2851; G01R 31/2886; G01R 31/2887; G01R 31/2889; G01R 35/00
(Continued)

(56) References Cited

U.S. PATENT DOCUMENTS 6,791,171 B2 *  9/2004  Mok ................. G01R 1/06711
                                                     257/678
6,798,227 B1 *  9/2004  Hwang ............. G01R 31/2806
                                                     324/750.22

(Continued)

*Primary Examiner* — Hoai-An D. Nguyen
(74) *Attorney, Agent, or Firm* — Li & Cai Intellectual Property (USA) Office (57) ABSTRACT

A probe card device includes an upper die unit, a lower die unit, a spacer sandwiched between the upper and lower die units, an impedance adjusting member, and conductive probes. The upper die unit includes a first die and a second die spaced apart from the first die. The first die has a penetrating hole, and the second die has a circuit layer. The impedance adjusting member is disposed on the second die and is electrically coupled to the circuit layer. Each of the conductive probes passes through the upper die unit, the spacer, and the lower die unit. At least one of the conductive probes includes an upper contacting segment protruding from the upper die unit and an extending arm connected to the upper contacting segment. The extending arm is abutted against the circuit layer by passing through the penetrating hole.

10 Claims, 8 Drawing Sheets (51) Int. Cl.
   *G01R 3/00*     (2006.01)
   *G01R 31/26*    (2020.01)
   *G01R 35/00*    (2006.01)

(52) U.S. Cl.
   CPC ............... *G01R 3/00* (2013.01); *G01R 31/26* (2013.01); *G01R 35/00* (2013.01)

(58) Field of Classification Search
   USPC ......... 324/500, 537, 754.01, 754.03, 754.07, 324/756.01, 756.03
   See application file for complete search history.

(56) References Cited

U.S. PATENT DOCUMENTS

| | | | |
|---|---|---|---|
| 7,034,629 B2* | 4/2006 | Tsironis | H01P 5/04 333/17.3 |
| 8,836,356 B2* | 9/2014 | Audette | G01R 1/067 324/750.08 |
| 10,732,202 B2* | 8/2020 | Bocash | G01R 3/00 |
| 2010/0213960 A1* | 8/2010 | Mok | G01R 31/2889 324/762.03 |
| 2020/0166543 A1* | 5/2020 | Lee | G01R 1/07342 |
| 2020/0300893 A1* | 9/2020 | Lee | G01R 1/07342 |

* cited by examiner

PROBE CARD DEVICE AND MATCHING PROBE THEREOF

CROSS-REFERENCE TO RELATED PATENT APPLICATION

This application claims the benefit of priority to Taiwan Patent Application No. 107141538, filed on Nov. 21, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a detecting device, and more particularly to a probe card device and a matching probe thereof.

BACKGROUND OF THE DISCLOSURE

The operation speed of a device under test (DUT) (e.g., a semiconductor wafer) is developed to be higher and higher, so that when the DUT is tested, whether the DUT has a high frequency (or a high speed) transmission function also needs to be tested. However, each probe of a conventional probe card device is in a long and thin shape, which results in an increase in inductance value and further generates a power impedance issue, so that the conventional probe is not suitable for accurately testing the high speed transmission function of the DUT.

SUMMARY OF THE DISCLOSURE

In response to the above-referenced technical inadequacies, the present disclosure provides a probe card device and a matching probe thereof which improve the conventional probe card devices and the conventional probes.

In one aspect, the present disclosure provides a probe card device, which includes an upper die unit, an impedance adjusting member, a lower die unit, a spacer, and a plurality of conductive probes. The upper die unit includes a first die and a second die spaced apart from the first die. The first die has at least one penetrating hole, and the second die has a circuit layer. The impedance adjusting member is disposed on the second die and is electrically coupled to the circuit layer. The lower die unit is arranged at one side of the second die that is away from the first die. A distance between the lower die unit and the second die is larger than a distance between the first die and the second die. The spacer is sandwiched between the second die of the upper die unit and the lower die unit. The conductive probes pass through the upper die unit, the spacer, and the lower die unit. Each of the conductive probes includes an upper contacting segment and a lower contacting segment that are respectively arranged at two opposite outer sides of the upper die unit and the lower die unit. At least one of the conductive probes is defined as at least one matching probe including an extending arm connected to the upper contacting segment thereof, and wherein the extending arm of the at least one matching probe passes through the at least one penetrating hole to be in contact with the circuit layer, so that the at least one matching probe is electrically coupled to the impedance adjusting member through the circuit layer.

In one aspect, the present disclosure provides a matching probe of a probe card device, which includes an elongated pin and an extending arm. The pin has an outer diameter. The pin includes an upper contacting segment and a lower contacting segment that are respectively arranged at two opposite portions thereof. The lower contacting segment is configured to fix to a space transformer, and the upper contacting segment is configured to elastically and detachably abut against a device under test (DUT). The extending arm curvedly extends from a lateral side of the upper contacting segment toward the lower contacting segment. A free end of the upper contacting segment and a portion of the upper contacting segment connected to the extending arm are spaced apart by a distance that is larger than or equal to the outer diameter.

Therefore, the probe card device of the present disclosure is provided with at least one matching probe formed with an extending arm connected to the lateral side of the upper contacting segment that is used for abutting against a DUT, and the matching probe can be electrically coupled to the impedance adjusting member by the extending arm, thereby reducing the power impedance.

Specifically, the extending arm of the matching probe cooperates with the upper die unit by passing through the penetrating hole to contact with the circuit layer, so that the matching probe is electrically coupled to the impedance adjusting member through the circuit layer. Moreover, the extending arm of the matching probe is connected to the lateral side of the upper contacting segment that is used for abutting against a DUT, so that the impedance adjusting member corresponds in position to the upper die unit that is close to the DUT, thereby effectively reducing the impedance of signal transmission path.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a probe card device 100 (e.g., a vertical probe card device) that can be used to detect a high speed transmission function of a device under test (DUT) (e.g., a semiconductor wafer), but the present disclosure is not limited thereto.

Figure 1:
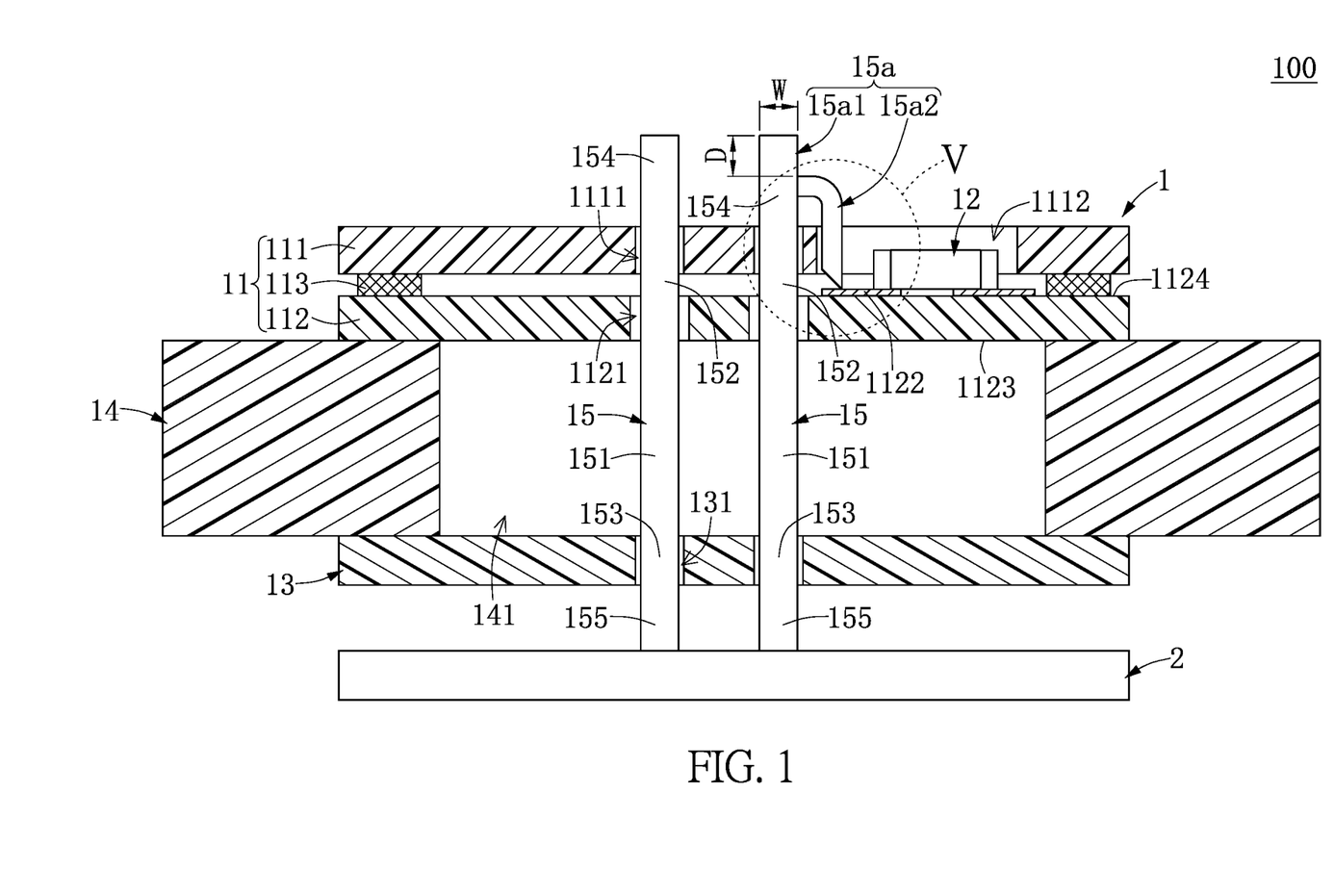
FIG. 1 is a cross-sectional view of a probe card device according to a first embodiment of the present disclosure.
Figure 2:
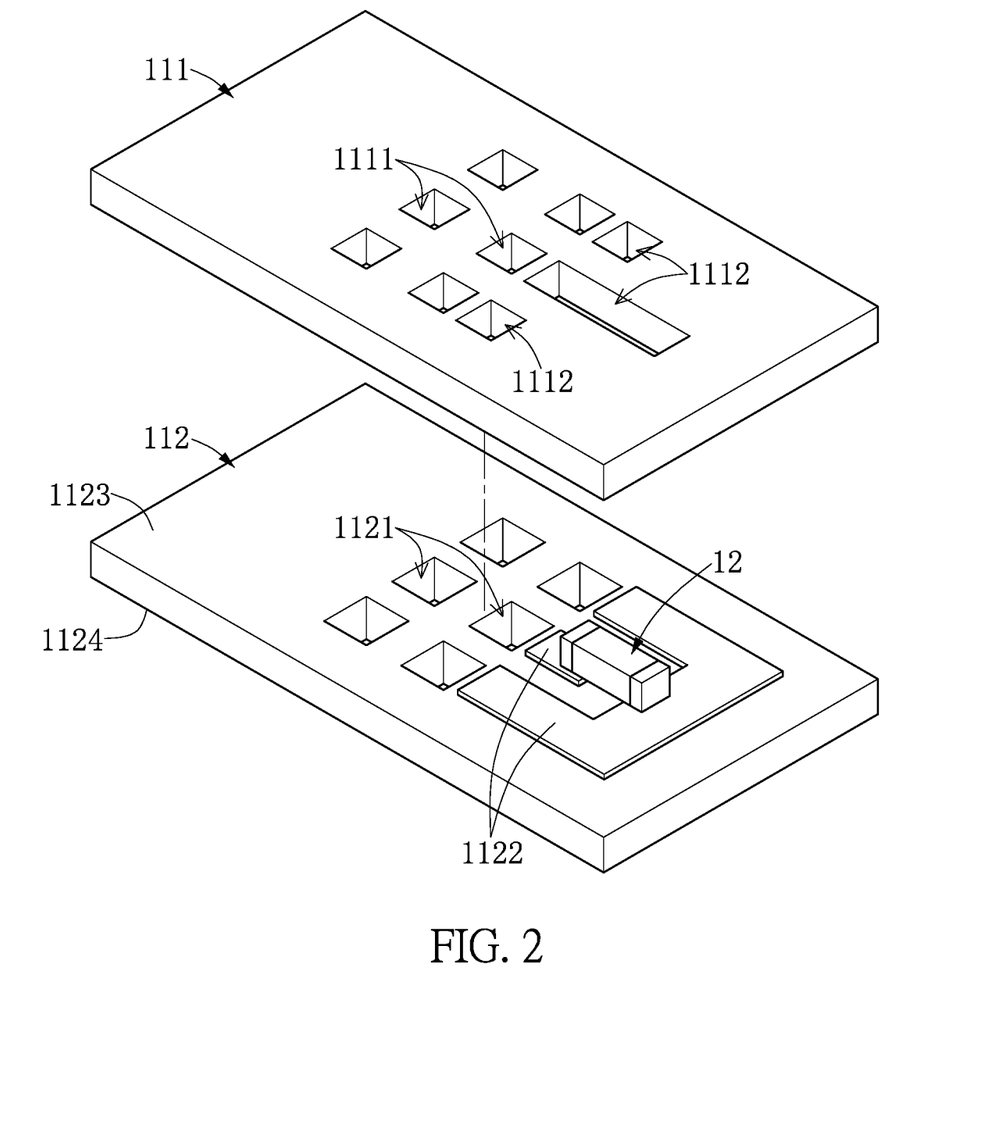
FIG. 2 is a perspective view showing an upper die unit and an impedance adjusting member of FIG. 1.

As shown in FIG. 1 and FIG. 2, the probe card device 100 includes a probe head 1 and a space transformer 2 connected to the probe head 1. The probe head 1 includes an upper die unit 11, a lower die unit 13 spaced apart from the upper die unit 11, an impedance adjusting member 12 mounted on the upper die unit 11, a spacer 14 sandwiched between the upper die unit 11 and the lower die unit 13, and a plurality of conductive probes 15, 15a passing through the upper die unit 11, the spacer 14, and the lower die unit 13.

It should be noted that, the upper die unit 11 and the lower die unit 13 in the present embodiment each include at least one rigid board, but the present disclosure is not limited thereto. The following description discloses the structure and relationship connection of each component of the probe head 1.

As shown in FIG. 1 and FIG. 2, the upper die unit 11 includes a first die 111, a second die 112 spaced apart from the first die 111, and a supporting board 113 sandwiched between the first die 111 and the second die 112. The first die 111 has a plurality of first thru-holes 1111 and a plurality of penetrating holes 1112, and the first thru-holes 1111 and the penetrating holes 1112 are formed by penetrating through the first die 111 along a thickness direction of the first die 111. The number of the penetrating holes 1112 in the present embodiment is less than or equal to the number of the first thru-holes 1111. The penetrating holes 1112 are preferably arranged in one row, and are formed at an outer side of the first thru-holes 1111. Each of the penetrating holes 1112 and one of the first thru-holes 1111 adjacent thereto have a gap that is smaller than a gap between any two of the first thru-holes 1111 adjacent to each other, but the present disclosure is not limited thereto.

The second die 112 has a plurality of second thru-holes 1121 and a circuit layer 1122. The second thru-holes 1121 are formed by penetrating through the second die 112 along a thickness direction of the second die 112. The number and position of the penetrating holes 1112 correspond to that of the first thru-holes 1111, and a size of each of the second thru-holes 1121 is preferably larger than that of each of the first thru-holes 1111. The shape of the first thru-hole 1111 or the shape of the second thru-hole 1121 can be changed according to design requirements, such as: a rectangular shape, a square shape, a circular shape, or other shapes.

Specifically, the second die 112 includes an inner board surface 1123 (e.g., a bottom surface of the second die 112 shown in FIG. 1) and an outer board surface 1124 (e.g., a top surface of the second die 112 shown in FIG. 1) that are opposite to the inner board surface 1123. The inner board surface 1123 faces the lower die unit 13, the outer board surface 1124 faces the first die 111, and the circuit layer 1122 in the present embodiment is disposed on the outer board surface 1124 of the second die 112. The circuit layer 1122 preferably corresponds in position to the penetrating holes 1112 of the first die 111. In other words, a projected region defined by orthogonally projecting the penetrating holes 1112 onto the outer board surface 1124 of the second die 112 is located on at least part of the circuit layer 1122.

The supporting board 113 in the present embodiment is ring-shaped (e.g., rectangular ring-shaped), and the supporting board 113 is sandwiched between a periphery portion of the first die 111 and a periphery portion of the second die 112, so that the first die 111 and the second die 112 can be spaced apart from each other by the supporting board 113. Moreover, the first thru-holes 1111 and the penetrating holes 1112 of the first die 111 and the second thru-holes 1121 of the second die 112 are in spatial communication with a space surrounding defined by an inner surface of the supporting board 113.

In addition, the supporting board 113 in the present embodiment is sandwiched between the first die 111 and the second die 112, but the present disclosure is not limited thereto. For example, in other embodiments of the present disclosure, the first die 111 can be formed with a thicker periphery portion to abut against the periphery portion of the second die 112, so that the supporting board 113 can be omitted. Moreover, the upper die unit 11 can be provided with a third die to replace the supporting board 113.

As shown in FIG. 1 and FIG. 2, the impedance adjusting member 12 in the present embodiment is a capacitor, but the present disclosure is not limited thereto. The impedance adjusting member 12 is disposed on the second die 112 and is electrically coupled to the circuit layer 1122. In the present embodiment, the impedance adjusting member 1122 is fixed on the outer board surface 1124, and is soldered onto the circuit layer 1122 arranged on the outer board surface 1124, but the present disclosure is not limited thereto. For example, in other embodiments of the present disclosure, the impedance adjusting member 12 can be fixed on a portion of the outer board surface 1124 that is not the circuit layer 1122, and the impedance adjusting member 12 is electrically coupled to the circuit layer 1122 by wire bonding.

Figure 3:
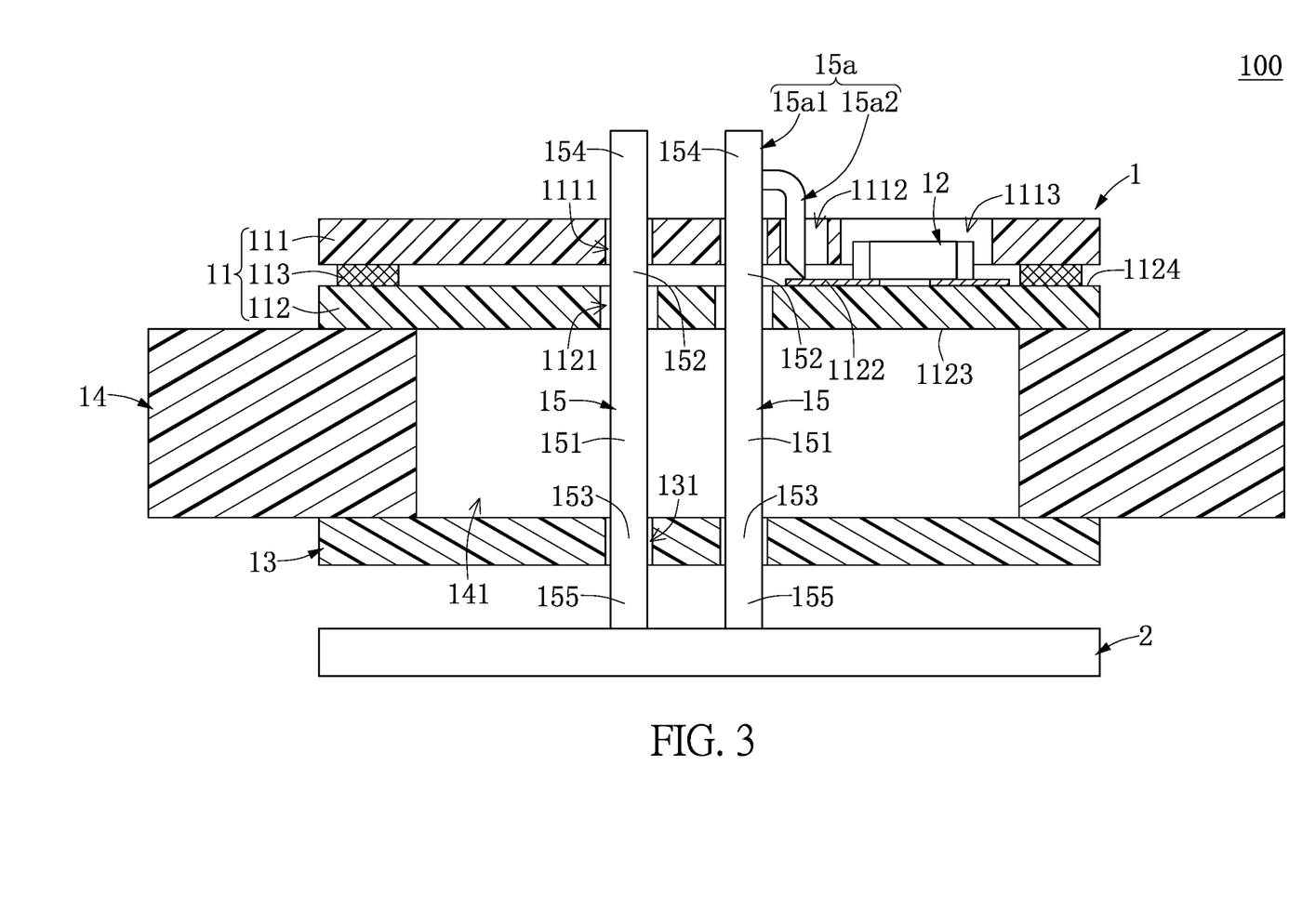
FIG. 3 is a cross-sectional view showing the probe card device in another configuration according to the first embodiment of the present disclosure.
Figure 4:
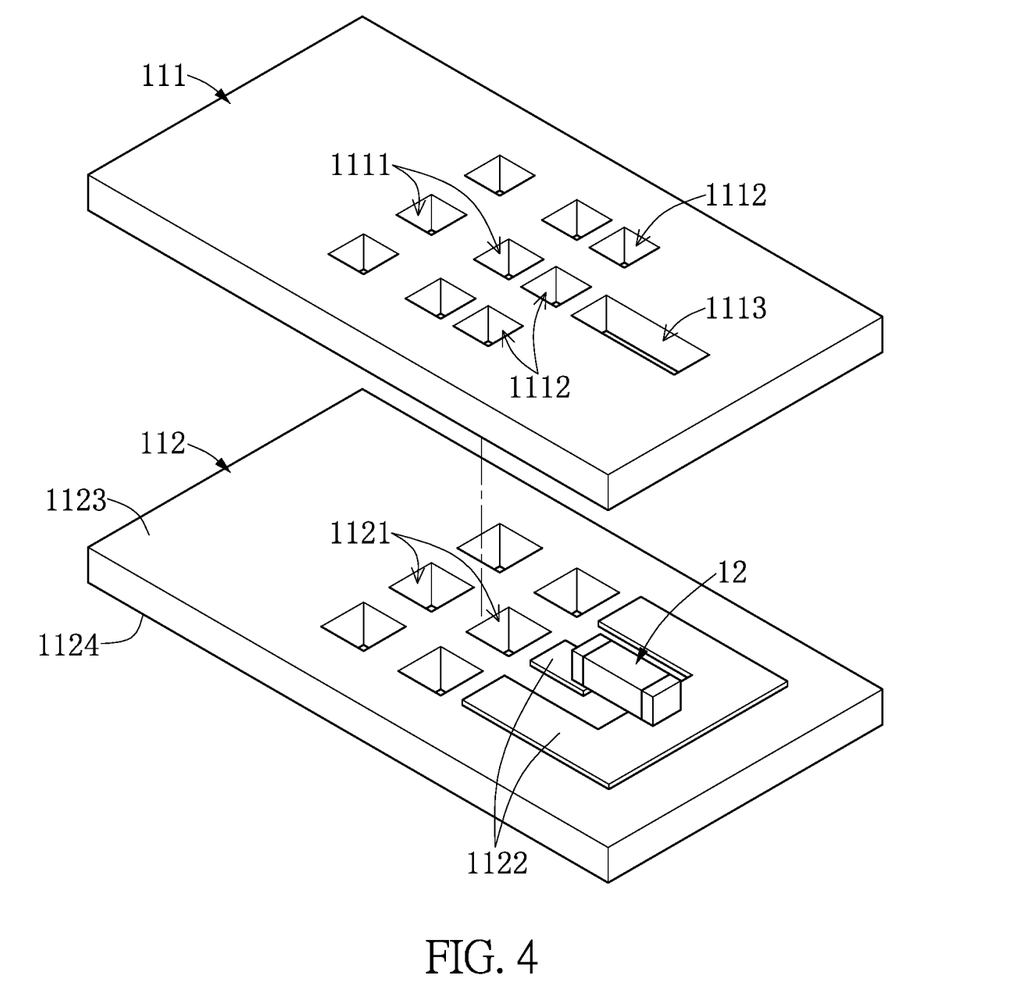
FIG. 4 is a perspective view showing an upper die unit and an impedance adjusting member of FIG. 3.
Figure 5:
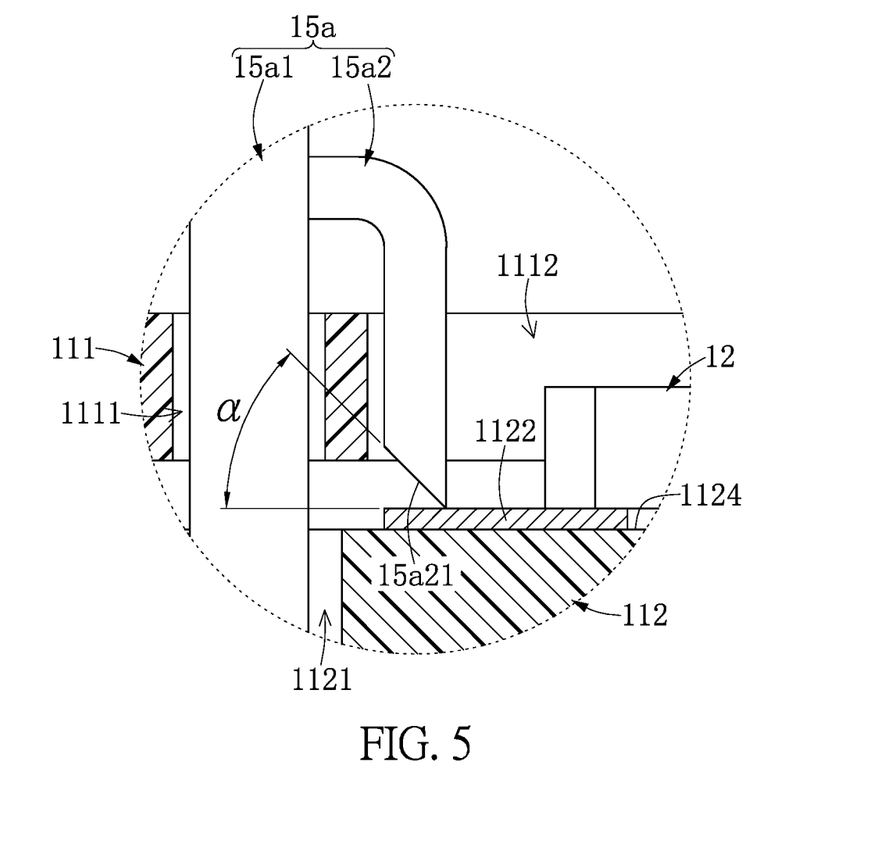
FIG. 5 is an enlarged view of portion V of FIG. 1.
Figure 6:
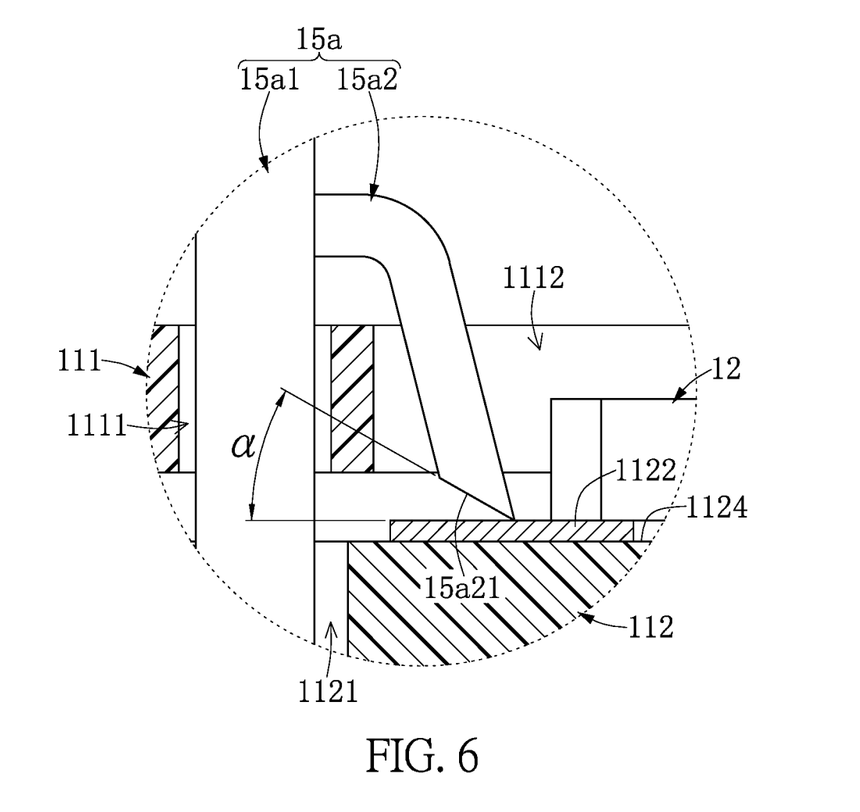
FIG. 6 is an enlarged view showing the portion V of FIG. 1 when a matching probe is pressed.

Moreover, at least part of the impedance adjusting member 12 is arranged in at least one of the penetrating holes 1112 of the first die 111, but the present disclosure is not limited thereto. For example, as shown in FIG. 3 and FIG. 4, the first die 111 can be formed with an accommodating slot 1113 adjacent to one of the penetrating holes 1112, and the at least part of the impedance adjusting member 12 is arranged in the accommodating slot 1113. Moreover, the accommodating slot 1113 shown in FIG. 3 and FIG. 4 is formed by penetrating through the first die 111, but in other embodiments of the present disclosure, the accommodating slot 1113 can be recessed in a bottom surface of the first die 111, but does not penetrate through a top surface of the first die 111.

As shown in FIG. 1 and FIG. 2, the spacer 14 is sandwiched between the second die 112 of the upper die unit 11 and the lower die unit 13, so that the lower die unit 13 can be arranged at one side of the second die 112 (e.g., a lower side of the second die 112 shown in FIG. 1) that is away from the first die 111. Moreover, a distance between the lower die unit 13 and the second die 112 is larger than a distance between the first die 111 and the second die 112.

In the present embodiment, the lower die unit 13 is a single board, and has a plurality of thru-holes 131 corresponding to the second thru-holes 1121 in position and number, but the present disclosure is not limited thereto. For example, in other embodiments of the present disclosure, the lower die unit 13 can include two boards and a supporting board sandwiched between the two boards.

Moreover, the spacer 14 in the present embodiment is in a ring shape (e.g., rectangular ring shape), the spacer 14 is sandwiched between a periphery portion of the second die 112 and a periphery portion of the lower die unit 13, and the second thru-holes 1121 of the second die 112 and the thru-holes 131 of the lower die unit 13 are in spatial communication with an accommodating space 141 surrounding defined by an inner surface of the spacer 14.

As shown in FIG. 1 and FIG. 2, the conductive probes 15, 15a pass through the upper die unit 11, the spacer 14, and the lower die unit 13. Each of the conductive probes 15, 15a includes a middle segment 151, an upper extending segment 152 and a lower extending segment 153 respectively extending from two opposite ends of the middle segment 151, an upper contacting segment 154 extending from the upper extending segment 152 along a direction away from the middle segment 151, and a lower contacting segment 155 extending from the lower extending segment 153 along a direction away from the middle segment 151.

In each of the conductive probes 15, 15a, the middle segment 151 is arranged in the accommodating space 141 of the spacer 14, the upper extending segment 152 is arranged in the upper die unit 11, the lower extending segment 153 is arranged in the lower die unit 13, and the upper contacting segment 154 and the lower contacting segment 155 are respectively arranged at two opposite outer sides of the upper die unit 11 and the lower die unit 13. The space transformer 2 is fixed to the lower contacting segments 155 of the conductive probes 15, 15a, and the upper contacting segments 154 of the conductive probes 15, 15a are configured to elastically and detachably abut against the DUT.

Moreover, the conductive probes 15, 15a include two different structures. Specifically, certain of the conductive probes 15, 15a (e.g., the right conductive probes 15a) are different from the other conductive probes 15, and each can be defined as a matching probe 15a. The matching probes 15a are preferably arranged in one row. It should be noted that, the matching probe 15a in the present embodiment is in operation with the above components, but the present disclosure is not limited thereto. In other words, the matching probe 15a in other embodiments of the present disclosure can be independently used (e.g., sold) or operated with other components.

As shown in FIG. 1 and FIG. 2, as the matching probes 15a are of the substantially same structure, the following description discloses the structure of just one of the matching probes 15a for the sake of brevity. The matching probe 15a includes an elongated pin 15a1 and an extending arm 15a2 connected to the pin 15a1.

The structure of the pin 15a1 is identical to that of the conductive probe 15 other than the matching probe 15a. That is to say, the pin 15a1 includes the middle segment 151, the upper extending segment 152 and the lower extending segment 153 respectively arranged at two opposite sides of the middle segment 151, and the upper contacting segment 154 and the lower contacting segment 155 respectively arranged at two opposite outer sides of the upper extending segment 152 and the lower extending segment 153. Moreover, each portion of the pin 15a1 in the present embodiment has the same outer diameter W, but the present disclosure is not limited thereto.

The extending arm 15a2 in the present embodiment is L-shaped, and is connected to the upper contacting segment 154 of the pin 15a1. Specifically, the extending arm 15a2 curvedly extends from a lateral side of the upper contacting segment 154 toward the lower contacting segment 155. Moreover, a free end of the upper contacting segment 154 and a portion of the upper contacting segment 154 connected to the extending arm 15a2 are spaced apart by a distance D that is larger than or equal to the outer diameter W (or an outer diameter of the upper contacting segment 154). Furthermore, a free end of the extending arm 15a2 has a guiding slanting surface 15a21 shown in FIG. 5, and a distance between the guiding slanting surface 15a21 and the pin 15a1 gradually increases along a direction from the upper contacting segment 154 to the lower contacting segment 155 (e.g., a direction from an upper side to a lower side shown in FIG. 5).

As shown in FIG. 1, FIG. 2, FIG. 5, and FIG. 6, the extending arms 15a2 of the matching probes 15a respectively pass through the penetrating holes 1112 of the first die 111 to be in contact with the circuit layer 1122 of the second die 112, so that the matching probes 15a are electrically coupled to the impedance adjusting member 12 through the circuit layer 1122 for reducing the power impedance. In addition, the guiding slanting surface 15a21 of each of the matching probes 15a and the circuit layer have an acute angle α therebetween. When the upper contacting segment 154 of any one of the matching probes 15a is pressed (e.g., when the probe card device 100 is used to detect the DUT), the extending arm 15a2 is outwardly and elastically deformed so that the connection is maintained with the circuit layer 1122, and the acute angle α gradually decreases. The term "outwardly deformed" in the present embodiment means that the extending arm 15a2 is deformed in a direction away from the pin 15a1.

It should be noted that, in other embodiments of the present disclosure, the number of the penetrating hole 1112 of the first die 111 and the number of the matching probe 15a of the conductive probes 15, 15a can each be at least one, and the layout of the circuit layer 1122 can be adjusted according to the at least one matching probe 15a. Specifically, the extending arm 15a2 of the at least one matching probe 15a passes through the at least one penetrating hole 1112 of the first die 111 to be in contact with the circuit layer 1122, so that the at least one matching probe 15a is electrically coupled to the impedance adjusting member 12 by the circuit layer 1122. Moreover, the lower contacting segment 155 of the at least one matching probe 15a is configured to fixed onto a space transformer 2, and the upper contacting segment 154 of the at least one matching probe 15a is configured to elastically and detachably abut against a DUT.

In addition, the conductive probe 15, 15a (or the pin 15a1) can be a round probe, a rectangular probe, a MEMS probe, or other probes. In other embodiments of the present disclosure, the upper die unit 11 and the lower die unit 13 can be staggered along a horizontal direction, so that the middle segments 151 of the conductive probes 15, 15a are elastically deformed into a curved shape. Moreover, the first die 111 and the second die 112 of the upper die unit 11 can be staggered along the horizontal direction, so that the upper contacting segment 154 of each of the conductive probes 15, 15a is maintained to be orthogonal to the first die 111.

Second Embodiment

Figure 7:
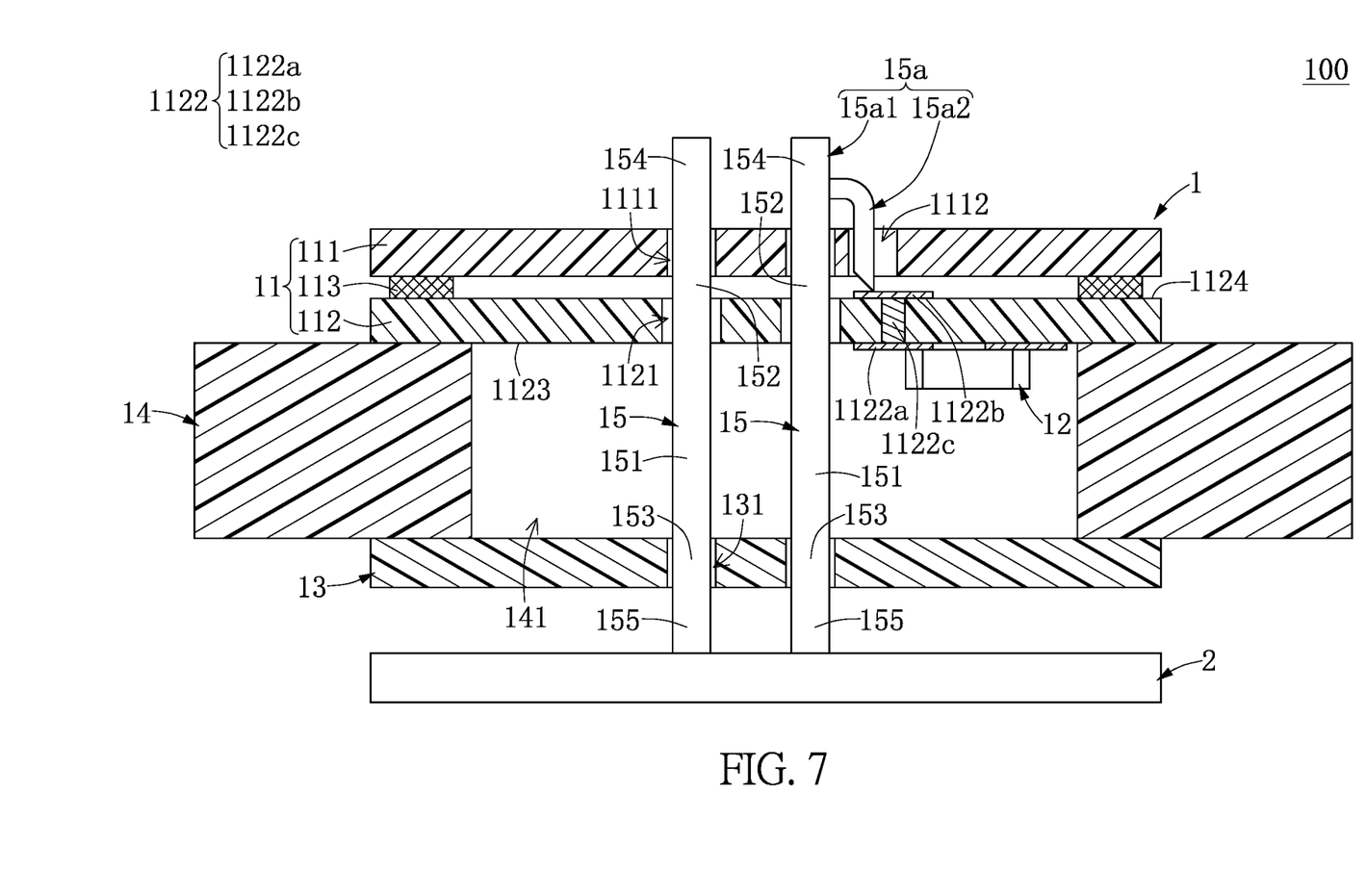
FIG. 7 is a cross-sectional view of a probe card device according to a second embodiment of the present disclosure.
Figure 8:
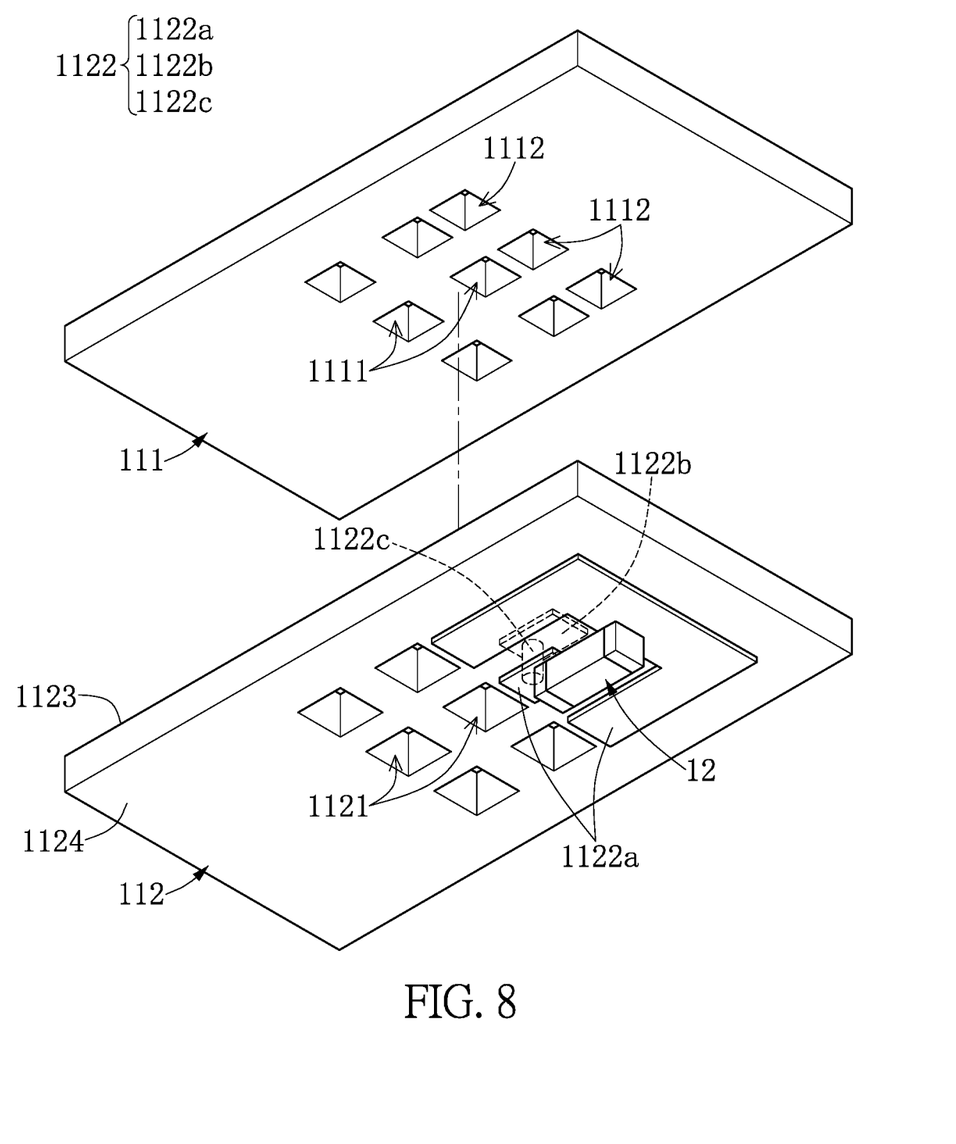
FIG. 8 is a perspective view showing an upper die unit and an impedance adjusting member of FIG. 7.

Referring to FIG. 7 and FIG. 8, a second embodiment of the present disclosure discloses a probe card device 100 that is similar to the probe card device 100 of the first embodiment, so that following description discloses only the different features of the present embodiment for the sake of brevity.

In the present embodiment, the impedance adjusting member 12 is fixed on the inner board surface 1123 of the second die 112, and the impedance adjusting member 12 is arranged in a space (i.e., the accommodating space 141) surroundingly defined by the spacer 14, thereby simplifying the structure of the first die 111.

Specifically, the circuit layer 1122 in the present embodiment includes an inner circuit 1122a disposed on the inner board surface 1123, an outer circuit 1122b disposed on the outer board surface 1124, and a conductive post 1122c embedded in the second die 112. Two opposite ends of the conductive post 1122c are respectively connected to the inner circuit 1122a and the outer circuit 1122b. Moreover, a projected region defined by orthogonally projecting the penetrating holes 1112 onto the outer board surface 1124 of the second die 112 is located on the outer circuit 1122b of the circuit layer 1122. The impedance adjusting member 12 is fixed on the inner circuit 1122a of the circuit layer 1122, and the extending arm 15a2 of each of the matching probes 15a is abutted against the outer circuit 1122b of the circuit layer 1122.

In conclusion, the probe card device of the present disclosure is provided with at least one matching probe that is formed with an extending arm connected to the lateral side of the upper contacting segment that is used for abutting against a DUT, and the extending arm of the matching probe can be electrically coupled to the impedance adjusting member by being cooperated with the upper die unit, thereby reducing the power impedance. Specifically, the extending arm of the matching probe can pass through the penetrating hole to be in contact with the circuit layer, so that the matching probe is electrically coupled to the impedance adjusting member by the circuit layer.

Moreover, the extending arm of the matching probe is connected to the lateral side of the upper contacting segment that is used for abutting against the DUT, so that the impedance adjusting member corresponds in position to the upper die unit that is close to the DUT, thereby effectively reducing the impedance of signal transmission path.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
    an upper die unit including a first die and a second die spaced apart from the first die, wherein the first die has at least one penetrating hole, and the second die has a circuit layer;
    an impedance adjusting member disposed on the second die and electrically coupled to the circuit layer;
    a lower die unit arranged at one side of the second die that is away from the first die, wherein a distance between the lower die unit and the second die is larger than a distance between the first die and the second die;
    a spacer sandwiched between the second die of the upper die unit and the lower die unit; and
    a plurality of conductive probes passing through the upper die unit, the spacer, and the lower die unit, wherein each of the conductive probes includes an upper contacting segment and a lower contacting segment that are respectively arranged at two opposite outer sides of the upper die unit and the lower die unit,
    wherein at least one of the conductive probes is defined as at least one matching probe including an extending arm connected to the upper contacting segment thereof, and wherein the extending arm of the at least one matching probe passes through the at least one penetrating hole to contact with the circuit layer, so that the at least one matching probe is electrically coupled to the impedance adjusting member through the circuit layer.

2. The probe card device according to claim 1, wherein the second die includes an inner board surface and an outer board surface opposite to the inner board surface, the outer board surface faces the first die, and the impedance adjusting member is fixed on the outer board surface.

3. The probe card device according to claim 2, wherein the circuit layer is disposed on the outer board surface, and at least part of the impedance adjusting member is arranged in the at least one of the penetrating hole of the first die.

4. The probe card device according to claim 1, wherein the second die includes an inner board surface and an outer board surface opposite to the inner board surface, the inner board surface faces the lower die unit, the impedance adjusting member is fixed on the inner board surface, and the impedance adjusting member is arranged in a space surroundingly defined by the spacer.

5. The probe card device according to claim 4, wherein the circuit layer includes:
    an inner circuit disposed on the inner board surface, wherein the impedance adjusting member is fixed on the inner circuit;

an outer circuit disposed on the outer board surface, wherein the extending arm is abutted against the outer circuit; and a conductive post embedded in the second die, wherein two opposite ends of the conductive post are respectively connected to the inner circuit and the outer circuit.

6. The probe card device according to claim 1, wherein the extending arm is L-shaped, a free end of the extending arm has a guiding slanting surface, and the guiding slanting surface and the circuit layer have an acute angle therebetween; wherein when the upper contacting segment of the at least one matching probe is pressed, the extending arm is outwardly and elastically deformed so that connection is maintained with the circuit layer, and the acute angle gradually decreases.

7. The probe card device according to claim 1, wherein in the at least one matching probe, the upper contacting segment has an outer diameter, and a free end of the upper contacting segment and a portion of the upper contacting segment connected to the extending arm are spaced apart by a distance that is larger than or equal to the outer diameter.

8. The probe card device according to claim 1, wherein the at least one matching probe is more than one, the at least one penetrating hole is more than one, and the matching probes are arranged in one row, and wherein the extending arms of the matching probes respectively pass through the penetrating holes to contact with the circuit layer, so that the matching probes are electrically coupled to the impedance adjusting member through the circuit layer.

9. The probe card device according to claim 1, wherein the upper die unit includes a supporting board sandwiched between the first die and the second die, the probe card device further includes a space transformer fixed to the lower contacting segments of the conductive probes, and the upper contacting segments of the conductive probes are configured to elastically and detachably abut against a device under test (DUT).

10. A matching probe of a probe card device, comprising:
an elongated pin having an outer diameter, wherein the pin includes an upper contacting segment and a lower contacting segment that are respectively arranged at two opposite portions thereof, the lower contacting segment is configured to fix to a space transformer, and the upper contacting segment is configured to elastically and detachably abut against a device under test (DUT); and
an extending arm curvedly extending from a lateral side of the upper contacting segment toward the lower contacting segment, wherein a free end of a upper contacting segment and a portion of the upper contacting segment connected to the extending arm by a distance that is larger than or equal to the outer diameter.

* * * * *